United States Patent [19]

Kondo et al.

[11] 4,381,198

[45] Apr. 26, 1983

[54] CERAMIC METALLIZING INK

[75] Inventors: Masaru Kondo; Hisaharu Shiromizu; Yoshio Ieda, all of Aichi, Japan

[73] Assignee: NGK Spark Plug Co., Ltd., Nagoya, Japan

[21] Appl. No.: 388,368

[22] Filed: Jun. 14, 1982

[30] Foreign Application Priority Data

Jun. 12, 1981 [JP] Japan .................................. 56-91015

[51] Int. Cl.$^3$ .............................................. C23C 3/00
[52] U.S. Cl. .................................. 106/1.12; 106/1.27; 106/20; 106/193 M; 106/194; 106/203; 252/515; 252/518; 524/81; 524/401; 524/406; 524/440
[58] Field of Search ....................... 106/1.12, 20, 1.27, 106/193 M, 194, 203; 252/515, 518; 524/81, 406, 440, 401

[56] References Cited

U.S. PATENT DOCUMENTS

| | | | |
|---|---|---|---|
| 3,620,799 | 11/1971 | Hoelscher | 427/373 |
| 3,853,582 | 12/1974 | Labossier et al. | 427/190 |
| 3,988,514 | 10/1976 | Denny et al. | 427/239 |

*Primary Examiner*—Lorenzo B. Hayes
*Assistant Examiner*—Amelia B. Yarbrough
*Attorney, Agent, or Firm*—Sughrue, Mion, Zinn, Macpeak and Seas

[57] ABSTRACT

A ceramic metallizing ink for forming low resistance conductors is described, said ink comprising a metal powder component comprising tungsten, molybdenum or a combination thereof as the main ingredient, and from about 0.03 to about 5.00% by weight nickel, from about 0.03 to about 5.00% by weight of nickel and from about 0.02 to about 0.90% by weight of copper, or from about 0.03 to about 5.00% by weight of nickel and from about 0.02 to about 0.70% by weight of cobalt, which are contained in the ink in a state of soluble compounds thereof, together with an organic binder and a solvent.

4 Claims, No Drawings

CERAMIC METALLIZING INK

FIELD OF THE INVENTION

The present invention relates to a ceramic metallizing ink, and particularly to a ceramic metallizing ink for forming low resistance conductors comprising two to four metallic ingredients.

BACKGROUND OF THE INVENTION

Generally, tungsten inks, molybdenum inks or Mo-Mn inks have been used for forming metallized layers on ceramics, and particularly on alumina porcelains. Examples of metallizing processes include a process which comprises applying a metallizing ink to a green molding, namely, an unfired molding, and carrying out metallization simultaneously with the firing of the ceramic, and a process which comprises carrying out metallization on porcelains. The tungsten inks or the molybdenum inks generally has been used for the former, and the Mo-Mu inks generally has been used for the latter.

With respect to obtaining a desired resistivity of the conductor using such earlier metallizing tungsten ink or molybdenum ink, it is noted that the resistivity depends upon width, thickness, and length of the coated face. In ceramic multilayer distributing boards adopted for present high density apparatus, it is required that the width of metallized distributing line be 100 μm or less. Further, it is required to form distribution coating lines having a thickness as thin as possible so as to form a smooth surface having a low degree of unevenness that 20 to 30 sheets on which distributing lines are formed can be superposed to produce a multilayer product, and thus the thickness of the distributing lines is 10 μm or less. Under such requirements, it is difficult to obtain metallized conductors having a desired low resistance using the prior tungsten ink or molybdenum inks.

SUMMARY OF THE INVENTION

As a result of extensive efforts for solving the above described problems, it has now been found that when the above described process which comprises applying a tungsten or molybdenum ink to alumina green moldings to form a coated face and carrying out metallization in a non-oxidative atmosphere simultaneously with firing of ceramics is utilized, a metallizing ink comprising from two to four metallic ingredients is suitable for forming a metallized low resistance conductor which can be used for producing a multilayer distributing board by applying the metallizing ink to sheets such as thin aluminium plates to form a coated face and superposing the sheets to form a laminate. In the case of using metallizing tungsten ink, it is necessary that a sintered layer of tungsten be formed on the surface of the porcelain and adhesion of the metallized layer to the porcelain be good. However, to do so, firing is required in a non-oxidative atmosphere having a high temperature of 1600° C. or more in order to sufficiently sinter the tungsten, because tungsten has a very high melting point. Thus, in low temperature fired porcelains, problems such as insufficient sintering of tungsten, etc., occur. The insufficient sintering of tungsten generally results in high resistance of conductors, because the spaces between tungsten grains under such circumstances are wide, and, consequently, it becomes difficult to obtain a desired low resistance of the conductor. The present invention has been accomplished on the basis of a determination that metallized conductors having low resistance can be obtained if certain metals having a lower melting point than tungsten are added in certain proportions, by which the tungsten grains are believed to be covered with the metals having a low melting point simultaneously with the firing, and the sintering of tungsten is enhanced to improve bonding between grains.

Therefore the present invention is a ceramic metallizing ink for forming low resistance conductors, said ink comprising a metal powder component comprising tungsten, molybdenum, or a combination thereof, as the main ingredients, and from about 0.03 to about 5.00% by weight nickel, from about 0.03 to about 5.00% by weight nickel and from about 0.02 to about 0.90% by weight copper, or from about 0.03 to about 5.00% by weight nickel and from about 0.02 to about 0.70% by weight cobalt, which are contained therein in a state of soluble compounds thereof, together with an organic binder and a solvent.

DETAILED DESCRIPTION OF THE INVENTION

The soluble compounds are used according to the process which comprises producing a solution of soluble compounds such as nickel sulfate, copper sulfate, or cobalt sulfate, adding the solution to a tungsten powder, a molybdenum powder, or a combination thereof (hereinafter more concisely referred to as "tungsten and/or molybdenum") blending therewith, and evaporating the solvent. The nickel sulfate, copper sulfate and cobalt sulfate, etc. are reduced to form nickel, copper and cobalt metals by firing in a non-oxidative atmosphere, and cover the surface of the grains of tungsten and/or molybdenum, by which the sintering property of tungsten and/or molybdenum is improved.

However, if nickel, cobalt, or copper is added as a metal powder, sufficient blending and dispersion of these metal with the tungsten and/or molybdenum can not be carried out, and the surface of the grains of tungsten and/or molybdenum is not covered with the metal having a lower melting point after carrying out the sintering, and, consequently, the desired effect by addition of the metal having a low melting point is not observed.

Further, in the case of using insoluble compounds such as nickel oxide, copper oxide, or cobalt oxide, good effect is also not obtained, even though they can become metallic by reduction when fired.

According to the present invention, the coating of grains of tungsten and/or molybdenum and reactions with ceramics can be accomplished if solely nickel sulfate is added to the tungsten powder and/or molybdenum powder. However, when a very small amount of copper sulfate or cobalt sulfate is additionally added, an alloy of nickel and copper or nickel and cobalt is formed to cover grains of tungsten and/or molybdenum so that sintering of tungsten and/or molybdenum is further promoted, and, at the same time, a part thereof diffuses into the ceramics to contribute to low resistance of the metallized conductor and improvement of adhesive strength.

In the above cases, of sulfate compounds has been described. However, other soluble compounds, such as nitrates also produce good results.

The metallizing ink, which comprises tungsten and/or molybdenum as the main ingredients, and nickel, nickel and copper, or nickel and cobalt, which are contained in the ink in a state of soluble compounds thereof produces good results, viz, low resistance of the conductor as compared with the prior tungsten inks or molybdenum inks, and it shows adhesive strength which does not result in problems in for practical use.

Table 1 shows examples of ink composition comprising tungsten and nickel according to the present invention, wherein the adhesive strength to the alumina plate and volume resistivity are indicated. As is obvious from the results, the reason why the amount of nickel added to the main ingredient viz, tungsten, is restricted so as to be in the range of from about 0.03 to about 5.00% by weight is based on the fact that, when the amount of nickel departs from the upper limit or the lower limit of the above range, the volume resistivity becomes $33.2 \times 10^{-6} \Omega$ cm (at 0.02 wt %) or $47.3 \times 10^{-6} \Omega$ cm (at 5.5 wt %), respectively, which is nearly the same as the $38.0 \times 10^{-6} \Omega$ cm of the prior tungsten ink, and thus the desirable effect of the addition is not observed. However, if the amount is in the above described range of the present invention, the volume resistivity is from $19.4 \times 10^{-6}$ (No. 5) to $25.3 \times 10^{-6} \Omega$ cm (No. 6) and the favorable effect of the addition is observed. Further, the adhesive strength is from 3.2 to 4.2 kg/mm$^2$ in the range according to the present invention.

Table 2 shows examples of ink compositions comprising tungsten, nickel, and copper according to the present invention, wherein adhesive strength to the alumina plate and volume resistivity are indicated. As is clear from the results, the reason why the amounts of nickel and copper added to the chief ingredient, e.g., tungsten, are restricted so as to be in the range of from about 0.03 to about 5.00% by weight of nickel and the range of from about 0.02 to about 0.90% by weight of copper is based on the fact that when the amounts thereof depart from the upper limit or the lower limit of the above described ranges, the volume resistivity becomes $31.5 \times 10^{-6} \Omega$ cm (No. 11) or $38.5 \times 10^{-6} \Omega$ cm (No. 17) which is nearly the same as the $38.0 \times 10^{-6} \Omega$ cm of the prior tungsten ink, and the desirable effect of the addition is not observed. However, if the amounts are in the above described ranges of the present invention, the volume resistivity becomes $9.5 \times 10^{-6}$ (No. 15) to $16.6 \times 10^{-6} \Omega$ cm (No. 12) and conductors having a low volume resistivity are obtained. Further, the adhesive strength is from 3.7 to 5.3 kg/mm$^2$ in the range according to the present invention.

Table 3 shows examples of ink compositions comprising tungsten, nickel and cobalt of the present invention. The reason why the amounts of nickel and cobalt added to the main ingredient, viz, tungsten, are restricted so as to be in the range of from about 0.03 to about 5.00% by weight nickel and the range of from about 0.02 to about 0.70% by weight cobalt is based on the fact that when the amounts thereof depart from the upper limit or the lower limit of the above described range, the volume resistivity becomes $34.6 \times 10^{-6} \Omega$ cm (No. 31) or $43.2 \times 10^{-6} \Omega$ cm (No. 37) which is nearly the same as the $38.0 \times 10^{-6} \Omega$ cm of the prior tungsten ink, and thus the desired effect of the addition is not observed. However, if the amounts are in the above described range of the present invention, the volume resistivity becomes $14.4 \times 10^{-6}$ (no. 34) to $23.4 \times 10^{-6} \Omega$ cm (No. 32) and conductors having a low volume resistivity are obtained. Further, the adhesive strength thereof is from 3.5 to 4.2 kg/mm$^2$, which do not problems for practical use.

Table 4 shows ink compositions comprising nickel and copper wherein molybdenum is used as the main ingredient instead of tungsten. As a result of adding from about 0.03 to about 5.00% by weight of nickel and from about 0.02 to about 0.90% by weight of copper to the molybdenum, the volume resistivity becomes $13.5 \times 10^{-6}$ (No. 43) to $21.0 \times 10^{-6} \Omega$ cm (No. 45) which are nearly the same as those of ink compositions comprising tungsten as the main ingredient, and the adhesive strength thereof is from 4.9 to 5.7 kg/mm$^2$, which is not very different from that of examples comprising tungsten as the main ingredient.

Table 5 shows ink compositions wherein nickel and cobalt are added to mixtures of tungsten and molybdenum having mixing ratios, by weight, to about 1:1 and about 1:0.2. When the ink compositions are in the ranges of the present invention, the volume resistivity is $14.1 \times 10^{-6}$ (No. 58) to $21.4 \times 10^{-6} \Omega$ cm (No. 51) and the adhesive strength is from 3.7 to 4.3 kg/mm$^2$, which are similarly excellent to those of metallizing inks comprising a single main ingredient as described above.

Suitable examples of the organic binder according to the present invention include cellulose-series resins such as ethyl cellulose, etc., acryl-series resins, phenol-series resins, etc. Suitable examples of the solvent according to the present invention include toluene, xylene, methyl ethyl ketone, acetates such as ethylacetate, butylcarbitol, a turpentine oil, etc. Suitable examples of the sintering assistant include $SiO_2$, MgO, CaO, etc.

In the following, examples are described, but the present invention is not limited thereto.

EXAMPLE 1

First, aqueous solutions containing 10% by weight and 1% by weight of nickel sulfate, respectively, were produced. These solutions were added to a tungsten powder having an average particle size of 1.33 $\mu$m, respectively, so as to result in % by weight contents as described in Table 1, calculated as nickel metal. After sufficiently stirring, the solutions were dried at 80° C. for 2 hours. With each of them, a solution containing 10% by weight of ethyl cellulose in oil of turpentine was blended to obtain metallizing inks each having an ink composition as shown in Table 1.

On the other hand, a green sheet having a thickness of 0.7 mm was formed using a slurry prepared by adding a sintering assistant and an organic binder to an alumina powder and mixing with a solvent. This sheet was cut in 50 mm square sheets, and the above described metallizing ink was applied to the upper face of the resulting sheets by screen printing so as to form an average thickness of lines of 12 $\mu$m, a width of lines of 200 $\mu$m and a length of lines of 120 mm. After being dried to remove the solvent, they were fired at 1500° C. for 2 hours in a mixed gas atmosphere composed of hydrogen and nitrogen containing mositure.

When the external appearance of all sintered (fired) samples were examined, warp of the base plate was not observed and the metallized layer adhered well to the base plate. The volume resistivity thereof was measured, and the adhesive strength was measured by the following manner.

The measurement method of adhesive strength: After plated with nickel in the thickness of about 3 $\mu$m on the surface of metallized pad having a diameter of 1.2 mm applied on the base plate, a copper wire having a diameter of 0.6 mm was perpendicularly set up on the center of the metallized pad and was soldered with an eutectic solder. The copper wire was drawn to the direction perpendicular to the surface of the metallized pad, and the tensile strength was measured by spring balance.

The results are shown in Table 1.

TABLE 1

| No. | Ink composition (% by weight) | | Adhesive strength kg/mm² | Volume resistivity (× 10⁻⁶ Ωcm) | Note |
|---|---|---|---|---|---|
| | W | Ni | | | |
| 1 | 99.98 | 0.02 | 4.2 | 33.2 | Outside of this invention |
| 2 | 99.97 | 0.03 | 4.2 | 24.5 | This invention |
| 3 | 99.50 | 0.50 | 4.0 | 19.8 | This invention |
| 4 | 99.00 | 1.00 | 3.7 | 17.6 | This invention |
| 5 | 97.00 | 3.00 | 3.5 | 19.4 | This invention |
| 6 | 95.00 | 5.00 | 3.2 | 25.3 | This invention |
| 7 | 94.50 | 5.50 | 3.1 | 47.3 | Outside of this invention |
| 8 | 100.00 | — | 4.9 | 38.0 | Outside of this invention for comparison |

(Note)
Each value is an average value of three samples.

EXAMPLE 2

First of all, aqueous solutions containing 10% by weight and 1% by weight of nickel sulfate and copper sulfate, respectively, were produced. These solutions were added to a tungsten powder having an average particle size of 1.33 μm, respectively, so as to result in % by weight contents as described in Table 2, calculated as nickel metal and copper metal. After sufficiently stirring, they were dried at 80° C. for 2 hours. With each of them, a solution containing 10% by weight of ethyl cellulose in oil of turpentine was blended to obtain metallizing inks each having an ink composition as shown in Table 2.

Further, formation of green sheets, printing with metallizing inks, and firing were all carried out by the same procedure as in Example 1.

When the external appearance was examined, warp of the base plate was not observed and the metallized layer adhered well to the base plate. The volume resistivity thereof was measured, and the adhesive strength was measured by carrying out soldering of the metallized layer. The results are shown in Table 2.

TABLE 2

| No. | Ink composition (% by weight) | | | Adhesive strength kg/mm² | Volume resistivity (× 10⁻⁶ Ωcm) | Note |
|---|---|---|---|---|---|---|
| | W | Ni | Cu | | | |
| 11 | 99.97 | 0.02 | 0.01 | 4.6 | 31.5 | Outside of this invention |
| 12 | 99.95 | 0.03 | 0.02 | 4.0 | 16.6 | This invention |
| 13 | 99.40 | 0.50 | 0.10 | 3.9 | 13.0 | This invention |
| 14 | 98.65 | 1.00 | 0.35 | 5.3 | 12.9 | This invention |
| 15 | 96.35 | 3.00 | 0.65 | 4.3 | 9.5 | This invention |
| 16 | 94.10 | 5.00 | 0.90 | 4.9 | 14.9 | This invention |
| 17 | 93.50 | 5.50 | 1.00 | 3.8 | 38.5 | Outside of this invention |
| 18 | 99.07 | 0.03 | 0.90 | 4.1 | 14.4 | This invention |
| 19 | 98.85 | 0.50 | 0.65 | 4.3 | 11.8 | This invention |
| 20 | 97.80 | 2.00 | 0.20 | 4.6 | 11.4 | This invention |
| 21 | 96.40 | 3.50 | 0.10 | 4.5 | 12.5 | This invention |
| 22 | 94.98 | 5.00 | 0.02 | 3.7 | 16.5 | This invention |

(Note)
Each value is an average value of three samples.

EXAMPLE 3

Aqueous solutions containing 10% by weight and 1% by weight of nickel sulfate and cobalt sulfate, respectively, were produced. These solutions were added to a tungsten powder having an average particle size of 1.33 μm, respectively, so as to result in % by weight contents as described in Table 3, calculated as nickel metal and cobalt metal, and metallizing inks each having an ink composition as shown in Table 3 were prepared by the same process as in Example 1.

Further, formation of green sheets, printing with metallizing inks, and firing thereof were all carried out by the same procedure as in Example 1.

When the external appearance was examined, warp of the base plate was not observed and the metallized layer adhered well to the base plate. The volume resistivity thereof was measured, and the adhesive strength was measured by carrying out soldering of the metallized layer. The results are shown in Table 3.

TABLE 3

| No. | Ink composition (% by weight) | | | Adhesive strength kg/mm² | Volume resistivity (× 10⁻⁶ Ωcm) | Note |
|---|---|---|---|---|---|---|
| | W | Ni | Co | | | |
| 31 | 99.97 | 0.02 | 0.01 | 4.4 | 34.6 | Outside of this invention |
| 32 | 99.95 | 0.03 | 0.02 | 3.5 | 23.4 | This invention |
| 33 | 99.27 | 0.03 | 0.70 | 3.7 | 16.9 | This invention |
| 34 | 97.68 | 2.30 | 0.02 | 3.5 | 14.4 | This invention |
| 35 | 96.00 | 3.50 | 0.50 | 4.0 | 17.6 | This invention |
| 36 | 94.30 | 5.00 | 0.70 | 4.2 | 19.0 | This invention |
| 37 | 93.90 | 5.30 | 0.80 | 4.5 | 43.2 | Outside of this invention |

(Note)
Each value is an average value of three samples.

EXAMPLE 4

Aqueous solutions containing 10% and 1% of nickel nitrate or copper nitrate, respectively, were produced by the same procedure as in Example 2, and they were blended with a tungsten powder having an average particle size of 1.33 μm so as to have compositions No. 13, No. 16, and No. 19 in Table 2 to prepare metallizing inks by the same process. On the other hand, green sheets formed by the same procedure as in Example 1 were printed using the above described metallizing inks to form printed distributing lines having the same size as in Example 1, and they were burned. In all sintered samples, adhesion to the base plate was excellent. It was ascertained that the adhesive strength was 4.0 to 5.0 kg/mm², which were substantially the same as those in Example 2 and the volume resistivities were from $10.5 \times 10^{-6}$ Ω cm to $15.2 \times 10^{-6}$ Ω cm, which were the same as in Example 2.

EXAMPLE 5

Metallizing inks were prepared by blending with a molybdenum powder having an average particle size of 0.65 μm by the same procedure as in Example 2 so as to have compositions shown in Table 4. Further, green sheets were printed by the same process as in Example 1 to form printed distributing lines having the same size as in Example 1, and fired. In all sintered samples, the warp of the base plate and the adhesion of the metallized layer to the base plate were not different from those in Example 2. The adhesive strength and the volume resistivity thereof were measured. The results are shown in Table 4.

TABLE 4

| No. | Ink composition (% by weight) | | | Adhesive strength kg/mm² | Volume resistivity (× 10⁻⁶ Ωcm) | Note |
| --- | --- | --- | --- | --- | --- | --- |
| | Mo | Ni | Cu | | | |
| 41 | 99.95 | 0.03 | 0.02 | 4.9 | 19.4 | This invention |
| 42 | 99.00 | 0.70 | 0.30 | 5.5 | 14.7 | This invention |
| 43 | 98.00 | 1.20 | 0.80 | 5.7 | 13.5 | This invention |
| 44 | 95.60 | 3.50 | 0.90 | 5.2 | 14.3 | This invention |
| 45 | 94.10 | 5.00 | 0.90 | 5.7 | 21.0 | This invention |
| 46 | 93.50 | 5.40 | 1.10 | 5.6 | 32.5 | Outside of this invention |

(Note)
Each value is an average value of three samples.

EXAMPLE 6

Aqueous solution containing 10% by weight and 1% by weight of nickel sulfate or cobalt sulfate, respectively were produced. These solutions were blended with a mixture of a tungsten powder having an average particle size of 1.33 μm and a molybdenum powder having an average particle size of 0.65 μm so as to result in % by weight shown in Table 5, calculated as nickel metal and cobalt metal, and metallizing inks were prepared by the same procedure as in the above described examples. Further, green sheets were printed by the same process in Example 1 to form printed distributing lines having the same size as in Example 1, and fired.

In all sintered samples, the warp of the base plate and the adhesion of the metallized layer to the base plate were not different from those in the above described examples. The adhesive strength and the volume resistivity thereof were measured. The results are shown in the following table.

TABLE 5

| No. | Ink composition (% by weight) | | | | Adhesive strength kg/mm² | Volume resistivity (× 10⁻⁶ Ωcm) | Note |
| --- | --- | --- | --- | --- | --- | --- | --- |
| | W | Mo | Ni | Co | | | |
| 51 | 50.00 | 49.45 | 0.03 | 0.02 | 4.1 | 21.4 | This invention |
| 52 | 49.80 | 49.00 | 0.50 | 0.70 | 3.8 | 15.6 | This invention |
| 53 | 49.00 | 48.85 | 2.00 | 0.05 | 3.7 | 17.0 | This invention |
| 54 | 48.50 | 48.00 | 3.00 | 0.50 | 4.3 | 16.1 | This invention |
| 55 | 47.30 | 47.00 | 5.00 | 0.70 | 4.0 | 18.7 | Outside of this invention |
| 56 | 47.00 | 47.00 | 5.20 | 0.80 | 4.7 | 32.9 | This invention |
| 57 | 79.15 | 19.80 | 1.00 | 0.05 | 3.9 | 16.8 | This invention |
| 58 | 77.80 | 19.40 | 2.50 | 0.30 | 4.2 | 14.1 | This invention |
| 59 | 76.00 | 19.00 | 4.40 | 0.60 | 4.3 | 17.3 | This invention |
| 60 | 75.20 | 18.80 | 5.20 | 0.80 | 4.6 | 30.4 | Outside of this invention |

(Note)
Each value is an average value of three samples.

COMPARATIVE EXAMPLE

100% by weight of a tungsten powder of an average particle size of 1.33 μm were blended with a solution containing 10% by weight of ethyl cellulose in oil of turpentine to prepare a metallizing ink.

In addition, formation of the green sheet, printing and burning thereof were carried out by the same procedure as in Example 1, and the adhesive strength and the volume resistivity were measured. Results are shown in Table 1 as No. 8.

The above described adhesive strength was obtained by soldering a lead frame on the metallized layer and measuring tensile strength by a spring balance. The volume resistivity was a calculated value obtained by multiplying the resistivity measured by a digital low ohm metal by the width of the conductor and the thickness of the conductor and dividing by the length of the conductor.

As described above, because the ceramic metallizing ink of the present invention forms a wiring having a lower resistivity than the prior tungsten ink, multilayer distributing boards, which have caused some problems when produced using the prior ink, can be easily produced with stabilized quality. Further, the present invention is also excellent because over heating is prevented because of a low resistivity of wiring even if the distributing lines are formed so as to have a minimum width and a minimum thickness and further high speed production of electric circuit can be achieved. Accordingly, it has a large industrial value.

While the invention has been described in detail and with reference to specific embodiments thereof, it will be apparent to one skilled in the art that various changes and modifications can be made therein without departing from the spirit and scope thereof.

What is claimed is:

1. A ceramic metallizing ink for forming low resistance conductors, said ink comprising a metal powder component comprising tungsten, molybdenum or a combination thereof as the main ingredient, and (i) from about 0.03 to about 5.00% by weight nickel, (ii) from about 0.03 to about 5.00% by weight of nickel and from about 0.02 to about 0.90% by weight of copper, or (iii) from about 0.03 to about 5.00% by weight of nickel and from about 0.02 to about 0.70% by weight of cobalt, which are contained in the ink in a sate of soluble salts thereof, together with an organic binder and a solvent.

2. A ceramic metallizing ink according to claim 1, wherein such soluble compound is selected from a group consisting of sulfate compounds and nitrate compounds.

3. A ceramic metallizing ink according to claim 1, wherein said organic binder is selected from a group consisting of cellulose-series resins, acryl-series resins and phenol-series resins.

4. A ceramic metallizing ink according to claim 1 wherein said solvent is selected from a group consisting of toluene, xylene, methyl ethyl ketone, acetates, butyl-carbitol and a turpentine oil.

* * * * *